United States Patent
Elagha

(10) Patent No.: US 11,658,444 B2
(45) Date of Patent: May 23, 2023

(54) RETRACTABLE PROTECTIVE SLEEVE FOR PORTABLE CHARGING CABLE

(71) Applicant: Riyad K. Elagha, Orland Park, IL (US)

(72) Inventor: Riyad K. Elagha, Orland Park, IL (US)

(*) Notice: Subject to any disclaimer, the term of this patent is extended or adjusted under 35 U.S.C. 154(b) by 856 days.

(21) Appl. No.: 16/420,535

(22) Filed: May 23, 2019

(65) Prior Publication Data

US 2020/0119500 A1 Apr. 16, 2020

Related U.S. Application Data

(60) Provisional application No. 62/778,080, filed on Dec. 11, 2018, provisional application No. 62/745,153, filed on Oct. 12, 2018.

(51) Int. Cl.
| | |
|---|---|
| *H01R 13/72* | (2006.01) |
| *H01R 35/02* | (2006.01) |
| *H01R 13/66* | (2006.01) |
| *H02J 7/00* | (2006.01) |
| *H02G 11/00* | (2006.01) |
| *H05K 5/02* | (2006.01) |

(52) U.S. Cl.
CPC .......... *H01R 13/72* (2013.01); *H01R 13/665* (2013.01); *H01R 35/02* (2013.01); *H02G 11/00* (2013.01); *H02J 7/00* (2013.01); *H02J 7/0042* (2013.01); *H05K 5/0247* (2013.01)

(58) Field of Classification Search
CPC ................................................ H01R 13/6315
See application file for complete search history.

(56) References Cited

U.S. PATENT DOCUMENTS

| | | | | |
|---|---|---|---|---|
| 5,167,516 A | * | 12/1992 | Tan | H01R 13/6485 439/140 |
| 5,518,411 A | | 5/1996 | Bellec | |
| 6,062,881 A | * | 5/2000 | Ellison | H01R 13/4538 439/141 |
| 6,167,291 A | * | 12/2000 | Barajas | A61B 5/303 606/41 |
| 7,686,629 B1 | | 3/2010 | Yu et al. | |
| 10,938,141 B2 | * | 3/2021 | Kien | H01R 43/26 |
| 2004/0204177 A1 | * | 10/2004 | Pon | H02J 7/0045 455/90.3 |
| 2005/0083011 A1 | * | 4/2005 | Yang | B60L 53/31 320/107 |
| 2006/0141865 A1 | * | 6/2006 | Su | H01R 27/00 439/607.01 |
| 2017/0117729 A1 | * | 4/2017 | Hirose | A63F 13/90 |
| 2020/0373701 A1 | * | 11/2020 | Kien | H01R 43/26 |

OTHER PUBLICATIONS

PCT International Search Report—PCT/US2019/055789—dated Dec. 18, 2019.

* cited by examiner

*Primary Examiner* — Hoa C Nguyen
*Assistant Examiner* — John B Freal
(74) *Attorney, Agent, or Firm* — Vitale, Vickrey, Niro, Solon & Gasey LLP

(57) ABSTRACT

The present disclosure relates to a charging cable having a protective sleeve which extends to an extended position to protect the charging end of the cable. The protective sleeve may be retracted to a retracted position to reveal the charging end and allow the cable to be plugged into an electronic device. Various embodiments are disclosed in which the protective sleeve may be spring loaded by a single spring, by a plurality of springs, or it may be manually operated.

7 Claims, 4 Drawing Sheets

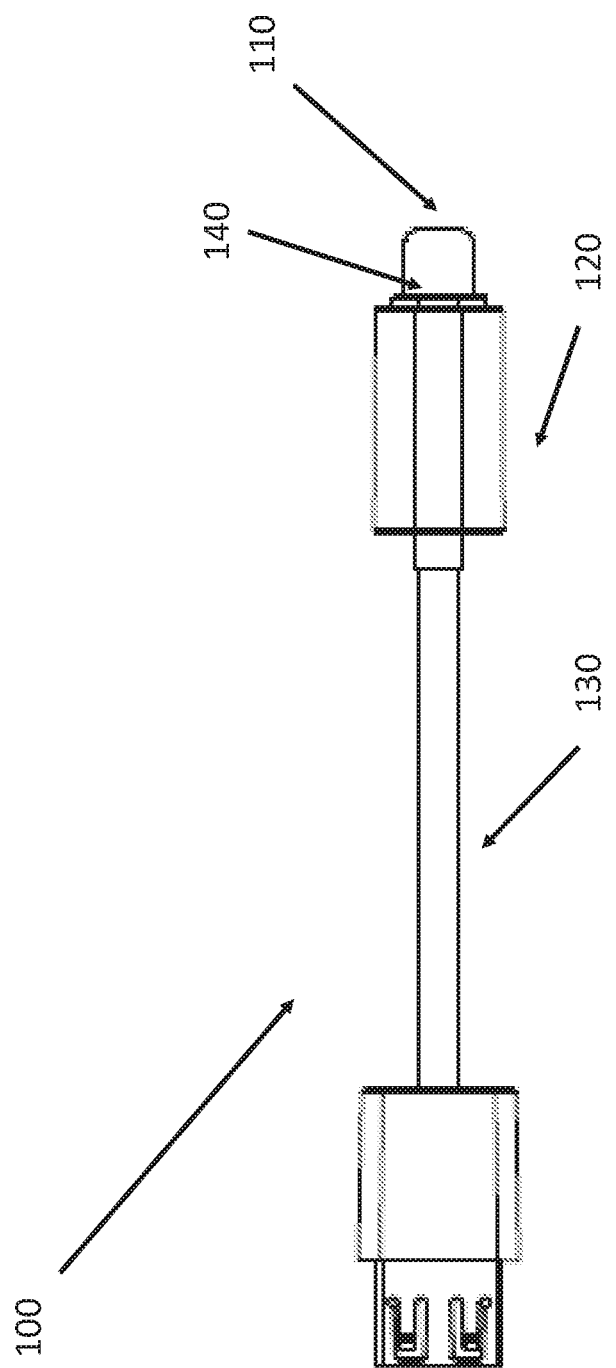

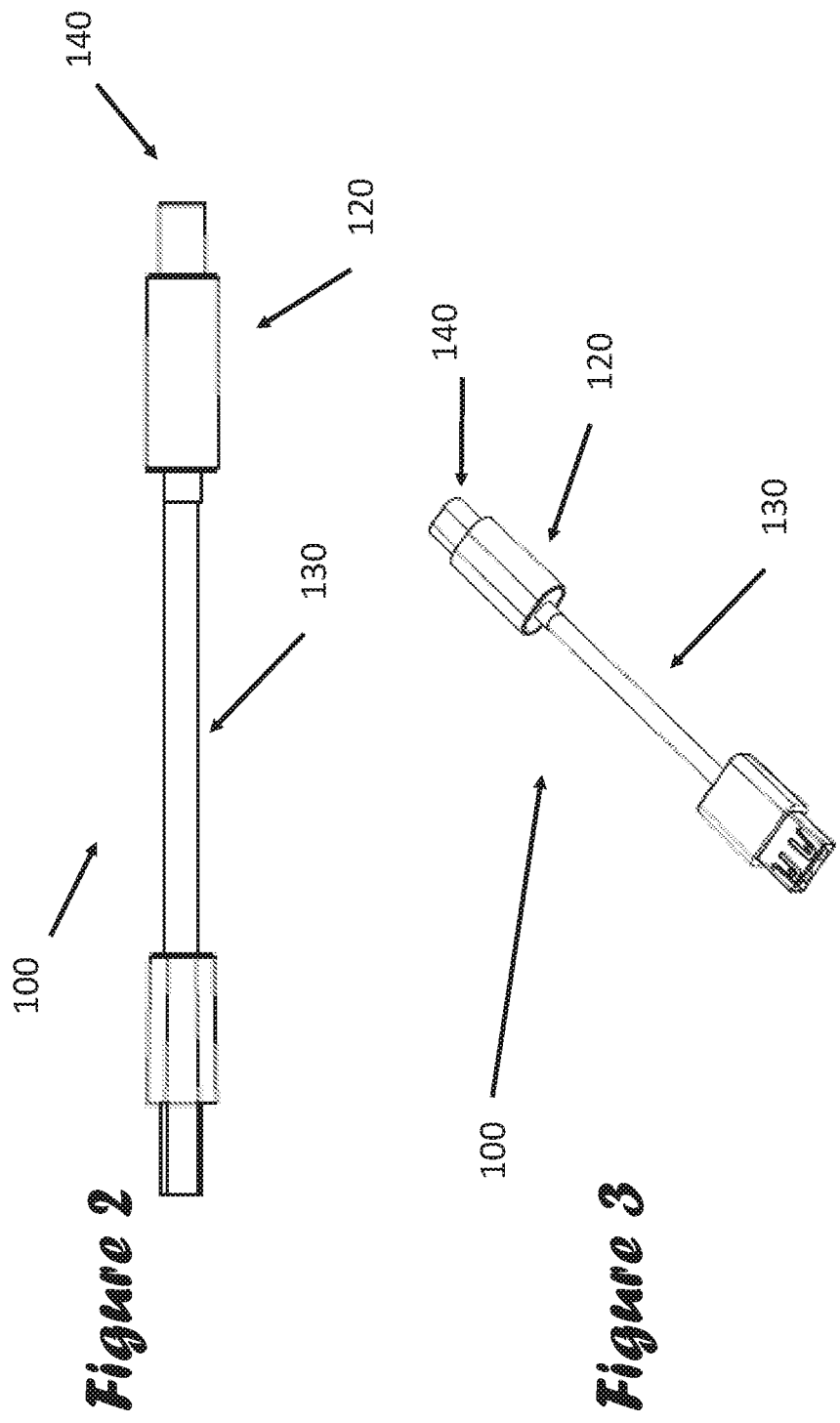

RETRACTABLE PROTECTIVE SLEEVE FOR PORTABLE CHARGING CABLE

STATEMENT OF PRIORITY

This patent application claims the benefit under 35 U.S.C. § 119(e) of U.S. Provisional Patent Application Ser. No. 62/745,153, filed by Applicant on Oct. 12, 2018; and U.S. Provisional Patent Application Ser. No. 62/778,080, filed by Applicant on Dec. 11, 2018. The provisional patent applications are hereby expressly incorporated by reference, in their entirety, as part of the present disclosure as if fully set forth herein.

FIELD OF THE INVENTION

The present inventions relate to the protection and shielding of a charging cable's connector.

BACKGROUND OF THE INVENTION

Electronic devices use charging cables, such as USB cables, Apple's "Lighting" cable, and so forth. Charging cables have a connector which is inserted into electronic devices such as smart phone, tablets, and the like. When the charging cable is not in use, the connector is exposed and therefore at risk of breaking off or being otherwise damaged. Therefore, there is a need for a charging cable which shields, or protects, the connector when it is not in use so that the connector does not break off, or become damaged in other ways.

BRIEF SUMMARY OF THE INVENTIONS

The present inventions improve upon the prior art charging cables by providing a protective sleeve which protects a connector from damage or breakage. The present inventions include a protective collar which surrounds, and shields, the connector. It retracts only when the charger is in use. The design may be compatible with chargers for all mobile devices, phones, tablets, and multimedia players.

Embodiments of the invention include a cable for charging electronic devices, having a cable in electronic communication with a connector, a slidable protective sleeve attached to the cable, wherein the protective sleeve has a retracted position and an extended position, and wherein the protective sleeve encompasses the connector in the extended position, and a first and second spring for biasing the protective sleeve to an extended position.

The protective sleeve may be aluminum or plastic, or any other suitable material. The first and second springs can be compression springs. In other embodiments, the protective sleeve may be manually slidable between an extended position and a retracted position.

BRIEF DESCRIPTION OF THE DRAWINGS

FIG. 1 shows a top view of an exemplary embodiment of the inventions.

FIG. 2 shows a side view of an exemplary embodiment of the inventions.

FIG. 3 shows a perspective view of an exemplary embodiment of the inventions.

DETAILED DESCRIPTION OF THE PREFERRED EMBODIMENTS

Figure 5:
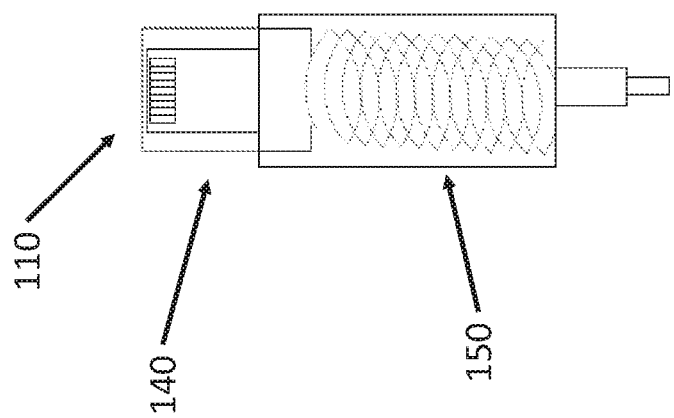
FIG. 5 shows a cut-out view of an embodiment of the inventions having a single tension spring in the extended position.

Set forth below is a description of what are currently believed to be the preferred embodiments or best representative examples of the inventions disclosed and claimed herein. Present and future representations or modifications to the embodiments and preferred embodiments are also contemplated. It should be understood that the inventions are not limited in its application to the details of construction and the arrangement of components set forth in the following description or illustrated in the drawings. The invention is capable of other embodiments and of being practiced or carried out in various ways. The following discussion is presented to enable a person of ordinary skill in the art to make and use embodiments of the invention.

Figure 4:
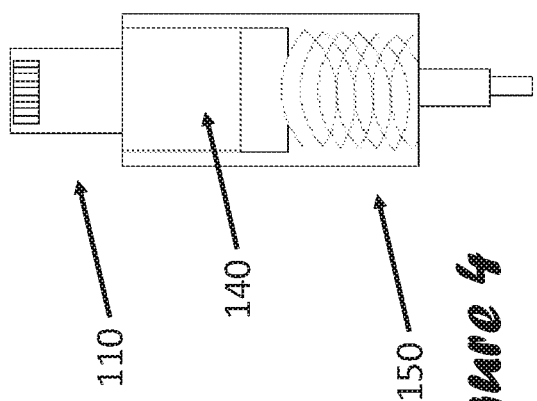
FIG. 4 shows a cut-out view of an embodiment of the inventions having a single tension spring in the compressed position.
Figure 6:
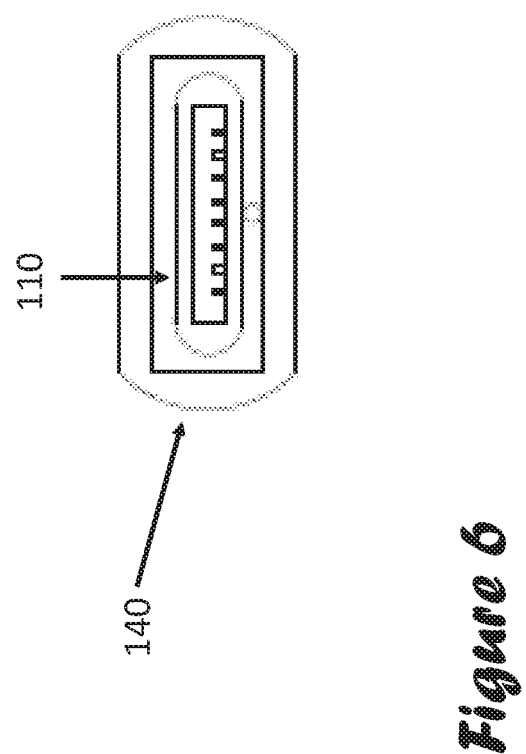
FIG. 6 shows a plan view of the top of an embodiment of the invention, in which a protective collar is seen surrounding a connector.

It is known that cables of the prior art are disadvantageous because their connector is exposed, and thus prone to breaking off. FIG. 1 shows an exemplary cable 100 embodying aspects of the present inventions. The embodiment shown includes a connector 110 mounted to plastic 120 which is in turn connected to a cable 130. FIG. 2 show an embodiment of the invention, from a side view. FIG. 3 shows an embodiment of the invention, from a perspective view. As seen in FIGS. 4 and 5, embodiments of the inventions may include a protective collar 140 which encases connector 110, and thus protects connector 110 from breaking off, or becoming damaged in other ways. In particular, FIG. 5 shows an embodiment of the inventions, with the protective collar 140 engaged and encompassing connector 110. In FIG. 4, the protective collar 140 is retracted. The protective collar 140 may be slidable between an extended position, in which the connector 110 is encased by the protective collar 140, and a retracted position, in which the connector 110 is exposed. FIG. 6 shows the relationship between protective collar 140 and connector 110, from a plan view. It can be seen that protective collar 140 is larger than connector 110, thus allowing it to surround and encage connector 110.

As explained further herein, in some embodiments, the protective collar 140 may be biased towards its extended position. Thus, in such embodiments, the connector 110 is protected by default, unless a user retracts protective collar 140. Because connector 110 is, by default, encases by protective collar 140, it is less likely to break, and thus less likely to require replacement. In the embodiments of FIGS. 4 and 5, for example, protective collar 140 is biased towards its extended position (of FIG. 5) by a single spring 150 which is positioned below the protective collar or sleeve 140. To use cable 100, a user may force protective collar 140 against the bias of spring 150 to its retracted position.

A user of the invention may use cable 100 (and specifically, its connector 110) to connect to a device, for example for charging a battery or for transferring data between two devices. The sleeve, i.e. protective collar 140, will be compressed when the user pushes the connector 110 into the device. The sleeve is wider than the charging opening of the device, such as a phone. While sliding the connector 110 into the phone; the protective sleeve 140 will be compressed. When the user disconnects the connector 110 from the device, the spring will retract the protective sleeve out. Connector 110 can then be inserted into a devices charging port or data transfer port, such a USB port, USB-C port, Apple's lightning port, and the like.

Protective collar 140 may be made of aluminum, plastic, plastic blends, or any other material capable of protecting connector 110. Single spring 150 or double spring 160 and 170 bias the protective collar 140 into the extended position. The springs may be tension or compression springs, or any other spring known in the art. The springs may be comprised of galvanized iron or stainless steel. Connector 110 conducts electricity from cable 100 to a device being charged. When connector 110 is connected to a device, the protective collar 140 is retracted and springs 150, 160, 170 are compressed, thus revealing connector 110. When a user disconnects the electronic device, springs 150, 160, 170 bias the protective collar 140 back to its extended position, thus protecting connector 110 from breaking or becoming otherwise damaged.

What is claimed is:

1. A cable for charging electronic devices, comprising:
a cord having a protective collar end and a source end;
a USB port connector affixed to the source end of the cord;
a connector attached to the protective collar end of the cord for interfacing with a mobile device configured to removably attach to a mobile telephone device for charging a battery or transferring a data transmission in the mobile telephone device;
a sheath affixed to the protective collar end of the cord, the sheath is configured to accept a slidable protective collar wherein the slidable protective collar has a front edge and a back edge;
the cable in electronic communication through the connector for interfacing with the mobile device;
the slidable protective collar having a shape of the connector and adapted to be positioned within the sheath such that the sheath such that the sheath fully encompasses the slidable protective collar, wherein the slidable protective collar is movable between a retracted position within the sheath and an extended position outside the sheath, wherein the slidable protective collar completely encompasses the connector in the extended position outside the sheath such that the connector does not protrude outwardly from the front edge of protective collar, and wherein the connector is exposed when the slidable protective collar is in the retracted position such that the rear edge of the slidable protective collar is positioned within the sheath; and
a single compression spring positioned within the sheath, the single compression spring abuts the sheath and the slidable protective collar, wherein the single compression spring operates to bias the slidable protective collar to an extended position to cover the connector and is compressed when a force is placed on the slidable protective collar to move the slidable protective collar to the retracted position.

2. The cable of claim 1, wherein the protective collar is aluminum.

3. The cable of claim 1, wherein the protective collar is plastic.

4. The cable of claim 1, further comprising a second spring wherein the second spring abuts the sheath and the slidable protective collar, wherein the second spring operates to bias the slidable protective collar to an extended position to cover the connector and is compressed when a force is placed on the slidable protective collar to move the slidable protective collar to the retracted position.

5. The cable of claim 1, wherein the single compression spring is a helical spring.

6. The cable of claim 4, wherein the single compression spring and the second spring are both compression springs.

7. The cable of claim 6, wherein the single compression spring and the second spring are helical springs.

\* \* \* \* \*